United States Patent [19]

Messer

[11] Patent Number: 4,666,824

[45] Date of Patent: May 19, 1987

[54] PHOTOPOLYMER PROCESS AND COMPOSITION EMPLOYING A PHOTOOXIDIZABLE COMPONENT CAPABLE OF FORMING ENDOPEROXIDES

[75] Inventor: Wayne R. Messer, Landenberg, Pa.

[73] Assignee: Hercules Incorporated, Wilmington, Del.

[21] Appl. No.: 712,049

[22] Filed: Mar. 15, 1985

Related U.S. Application Data

[62] Division of Ser. No. 602,784, Apr. 23, 1984, Pat. No. 4,563,413.

[51] Int. Cl.$^4$ .................. G03C 5/16; G03C 1/68; G03F 7/26
[52] U.S. Cl. .................... 430/325; 430/330; 430/331; 430/309; 430/912; 430/281; 430/915; 430/302
[58] Field of Search ............ 430/325, 330, 331, 309, 430/912, 920, 922, 924, 281, 915, 302, 18

[56] References Cited

U.S. PATENT DOCUMENTS

| | | | |
|---|---|---|---|
| 2,996,515 | 8/1961 | Moore et al. | 260/340.3 |
| 3,597,343 | 8/1971 | Delzenne et al. | 204/159.23 |
| 3,647,467 | 3/1972 | Grubb | 96/90 |
| 3,697,280 | 10/1972 | Strilko | 96/90 |
| 3,721,566 | 3/1973 | Laridon et al. | 96/115 R |
| 3,847,609 | 11/1974 | Breslow et al. | 96/33 |
| 3,924,520 | 12/1975 | Boardman et al. | 96/33 |
| 3,926,642 | 12/1975 | Breslow et al. | 96/115 R |
| 4,271,259 | 6/1981 | Breslow et al. | 430/286 |
| 4,272,610 | 6/1981 | Breslow et al. | 430/302 |
| 4,315,998 | 2/1982 | Neckers et al. | 525/332 |
| 4,436,715 | 3/1984 | Schaap et al. | 423/579 |

FOREIGN PATENT DOCUMENTS 1560304  5/1980  United Kingdom .

OTHER PUBLICATIONS

K. Gollnick and G. O. Schenck, Chapter 10 in 1,4-Cyclo-addition Reactions, J. Hamer, Ed., Academic Press Inc., New York, N.Y., 1967.

T. Matsuura and I. Saito, Chapter 7 in Photochemistry of Heterocyclic Compounds, O. Buchardt, Ed., John Wiley & Sons, Inc., New York, N.Y. 1976.

H. H. Wasserman, Ann. N.Y. Acad. Sci., vol. 171, pp. 108-119 (1970).

Primary Examiner—John E. Kittle
Assistant Examiner—Cynthia Hamilton
Attorney, Agent, or Firm—Joanne W. Patterson

[57] ABSTRACT

The photosensitive composition of this invention contains (1) an ethylenically unsaturated component capable of forming a high polymer by addition polymerization or crosslinking, (2) a cyclic cisoid conjugated diene as a photooxidizable component capable of reacting with singlet oxygen to form an endoperoxide, and (3) a photooxygenation sensitizer. A process for preparing a photosensitive element, such as a relief printing plate, embodying a layer of such a composition is described.

19 Claims, No Drawings

PHOTOPOLYMER PROCESS AND COMPOSITION EMPLOYING A PHOTOOXIDIZABLE COMPONENT CAPABLE OF FORMING ENDOPEROXIDES

This application is a division of application Ser. No. 602,784, filed Apr. 23, 1984, now U.S. Pat. No. 4,563,413.

BACKGROUND OF THE INVENTION

This invention relates to photosensitive compositions and to photosensitive elements, for example, printing plates, embodying a layer of such compositions. More particularly, the invention relates to a process for making lithographic plates.

Compositions capable of being converted under the influence of radiation to rigid, insoluble, tough structures have become increasingly important in the preparation of printing elements. One of the fundamental patents relating to such compositions is U.S. Pat. No. 2,760,863 to Plambeck. In the process of the Plambeck patent, printing elements are produced directly by exposing to actinic light, through an image bearing process transparency, a layer of an essentially transparent composition containing an addition polymerizable, ethylenically unsaturated monomer and an addition polymerization initiator activatable by actinic radiation. The layer of polymerizable composition is supported on a suitable support, and exposure of the composition is continued until substantial polymerization of the composition has occurred in the exposed areas with substantially no polymerization occurring in the nonexposed areas. The unchanged material in the latter areas then is removed, as by treatment with a suitable solvent in which the polymerized composition in the exposed areas is insoluble. In the case of printing plates, this results in a raised relief image which corresponds to the transparent image of the transparency and which is suitable for use in letterpress work.

While extremely useful in the preparation of relief printing elements and images from dry transfer processes, the photopolymer compositions of the types disclosed by the Plambeck patent become less sensitive to radiation due to the diffusion of oxygen from the air into the photopolymer layer. The oxygen acts to inhibit the desired polymerization and crosslinking reactions. There are means of removing or preventing oxygen from saturating or desensitizing the photopolymer layer. One way is to store or treat the element in an essentially oxygen-free atmosphere of an inert gas such as carbon dioxide. This technique gives satisfactory results but requires special equipment and is time consuming. It also is known to add certain metal compounds such as tin salts, which are soluble in the photopolymer composition but which are nonreactive with the addition polymerization initiator. While a number of these compounds substantially reduce the influence of oxygen and improve the photographic speed of the photopolymer element, their utilization has not been entirely satisfactory.

U.S. Pat. Nos. 4,271,259 and 4,272,610 disclose a photochemical process for the preparation of printing plates that is not inhibited by oxygen and in fact depends upon oxygen being present during the exposure step. During exposure the ambient, triplet oxygen is converted to singlet oxygen which is involved in the formation of hydroperoxides and peroxides. These intermediates are subsequently decomposed either concurrently with or subsequent to their formation, preferably in the absence of oxygen, thereby generating free radicals which effect polymerization and/or crosslinking of the photosensitive composition. The process includes the steps of (A) providing a photosensitive composition in film form comprising (1) a photooxygenation sensitizer, (2) an ethylenically unsaturated component capable of forming a high polymer by addition polymerization or crosslinking and (3) a photooxidizable component containing olefinic unsaturation of the type in which there is no more than one hydrogen atom on each of the double bond carbons and in which there is at least one allylic hydrogen on at least one of the carbons adjacent to the double bond carbons, which allylic hydrogen is not on a bridgehead carbon, (B) exposing selected areas of the sensitized film to light having a wave length of from about 2000 to about 12,000 Angstroms in the presence of oxygen and (C) treating the exposed film with heat, a metal catalyst or a nonmetallic reducing agent to form a crosslinked polymer in the exposed areas of the film.

SUMMARY OF THE INVENTION

It has now been found that a photooxidizable component which cannot form an allylic hydroperoxide with an olefin but which will react with singlet oxygen to form an endoperoxide and its decomposition products is also effective in initiating polymerization in a photosensitive composition. These endoperoxide-forming components can provide photospeeds equal to that of the prior art compositions under the same processing conditions. In contrast to the photooxidizable components of the prior art which contain allylic hydrogen, the photooxidizable components of the present invention are not readily autooxidized by triplet oxygen. This lack of susceptibility to oxidation reduces the formation of background material, i.e., polymerization in unexposed areas. The singlet oxygen acceptors of the present invention also have the advantage of being commercially available compounds, thus avoiding synthesis of the preferred acceptors disclosed by the prior art.

It is an object of this invention to provide an improved photosensitive composition that is not inhibited by oxygen during the exposure step. It is a further object of the invention to provide an improved photosensitive composition containing a photooxidizable component capable of reacting with singlet oxygen to form an endoperoxide effective in initiating polymerization after oxygen has been removed.

This invention additionally relates to a process for preparing a photosensitive element, such as a relief printing plate, embodying a layer of such a composition. More specifically, this invention relates to the preparation of lithographic printing plates and photoresists.

According to the present invention there is provided an improved photosensitive composition comprising (1) from about 5% to about 98% of a free radical polymerizable ethylenically unsaturated component capable of forming a high molecular weight polymer by addition polymerization or crosslinking, (2) a photooxidiazable component comprising a cyclic cisoid conjugated diene capable of 1,4-addition with singlet oxygen to form an endoperoxide in an amount which will contribute to the photosensitive composition at least $1.0 \times 10^{-3}$ moles of olefinic unsaturation per 1000 cc of the composition, and (3) a photooxygenation sensitizer.

DETAILED DESCRIPTION OF THE INVENTION

The photosensitive compositions of this invention contain a photooxidizable component which will contribute to the composition at least $1.0 \times 10^{-3}$ moles per 1000 cc of the composition, and preferably at least $1.0 \times 10^{31\,2}$ moles per 1000 cc, of olefinic unsaturation of the type in which the double bonds of a cyclic conjugated diene have a cisoid configuration, that is, the double bonds are facing each other on the same side of the single C—C bond

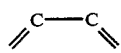

1,4-Addition of singlet oxygen to such a cyclic cisoid conjugated diene occurs to initially form endoperoxides, e.g., I-II, which may undergo further reaction.

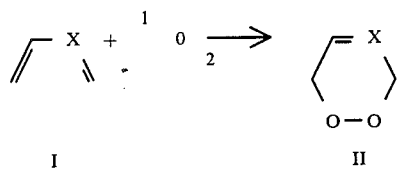

Endoperoxides will not form when the double bonds have a transoid configuration.

The cyclic cisoid conjugated diene has the general formula

where X is —O—,

or part of an anthracene ring system and a, b, c and d are —N= or an unsubstituted or aryl-substituted C atom which may be part of a carbocyclic ring system.

Representative examples of these photooxidizable materials include 2,5-diphenyloxazole, 2-(α-naphthyl)-5-phenyloxazole, 1,4-bis(5-phenyloxazol-2-yl)benzene, 2,5-bis(4-biphenylyl)oxazole, 2-(4-methylphenyl)-4,5-diphenyloxazole, 5-(4-methylphenyl)-2-(1-naphthalenyl)oxazole, 2-(4-methylphenyl)-5-(4-nitrophenyl)oxazole, 2-(4-methylphenyl)-5-phenyloxazole, 4-(4-methylphenyl)-2-phenyloxazole, 5-(4-methylphenyl)-2-phenyloxazole, 5-(3,4-dimethylphenyl)-2-phenyloxazole, 2-(4-methoxyphenyl)-5-phenyloxazole, 5-(4-methoxyphenyl)-2-phenyloxazole, 2-(4-chlorophenyl)-5-phenyloxazole, 2-(4-chlorophenyl)-5-phenyloxazole, 2,5-bis(4-methylphenyl)furan, 2,5-bis(4-chlorophenyl)furan, tetraphenylfuran, 2,5-diphenylfuran, 9-methylanthracene, 1,3-diphenylisobenzofuran and tetraphenylcyclopentadienone.

Also essential to the compositions used in the process of this invention is an ethylenically unsaturated component capable of forming a high molecular weight polymer by addition polymerization or crosslinking. This component should comprise from about 5% to about 98% of the photosensitive composition. This component may be either monomeric or polymeric, and mixtures of monomers, mixtures of polymers and mixtures of monomers with polymers may be used. The preferred monomers are those having terminal ethylenic unsaturation of the

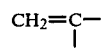

type. When using a monoethylenically unsaturated monomer it is desirable to have a polymeric component or a polyfunctional monomeric component also present. Such a polymeric component is preferably an unsaturated polymer which will copolymerize with the monomer to form a crosslinked polymer. Representative of the monoethylenically unsaturated monomers are acrylic and methacrylic acids, their esters with $C_1$-$C_{20}$ monohydric alcohols, for example, methyl acrylate, ethyl acrylate, n-butyl acrylate, methyl methacrylate and isopropyl methacrylate, and their esters with other alcohols, for example, hydroxyethyl acrylate, hydroxyethyl methacrylate, dimethylaminoethyl acrylate, dimethylaminoethyl methacrylate and 2-chloroethyl acrylate, acrylamide, methacrylamide, N-vinylpyrrolidone, acrylonitrile and methacrylonitrile; vinyl propionate and vinyl benzoate; vinyl ethers and sulfides such as methyl vinyl ether and methyl vinyl sulfide; vinyl ketones such as methyl vinyl ketone; vinyl halides and vinylidene halides such as vinyl chloride and vinylidene chloride; allyl ethers such as allyl phenyl ether and allyl iso-amyl ether; allyl esters such as allyl acetate, allyl butyrate and allyl benzoate; and vinyl aromatics such as styrene and α-methylstyrene.

In addition to or in place of the above monomers, which are all monoethylenically unsaturated, it is advantageous to utilize in the photosensitive composition, as all or part of the ethylenically unsaturated component, monomers which are polyethylenically unsaturated, since such monomers ordinarily provide a more tightly crosslinked system. These crosslinking monomers have their unsaturation in the form of at least two

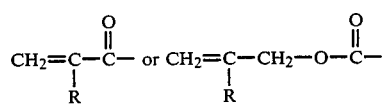

groups, wherein R is hydrogen or a $C_1$-$C_3$ alkyl group. One useful monomer is 1,3,5-triacryloylhexahydro-1,3,5-triazine. This compound and related compounds such as the corresponding methacryloyl derivative have the structural formula

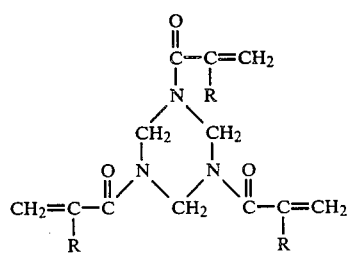

wherein R is hydrogen or a $C_1$-$C_3$ alkyl group.

Other suitable monomers may be defined by the structural formula

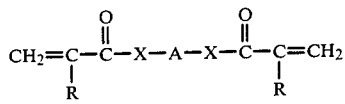   II wherein R again is hydrogen or a $C_1$-$C_3$ alkyl group, both X's are either —NH— or —O— and A is alkylene, substituted alkylene or alkylene oxyalkylene. Exemplary of the latter are those compounds having the formula

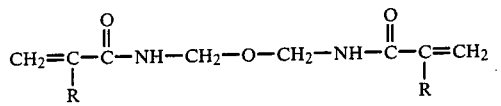   III

A preferred monomer having this formula is N,N'-oxydimethylene-bis(acrylamide).

When X in formula II above again is —NH—, but A is alkylene or substituted alkylene, this is descriptive of another preferred monomer, N,N'-methylene-bis(acrylamide). This compound is one member of a group of monomers for use in the process of this invention, which monomers are represented by compounds having the formula

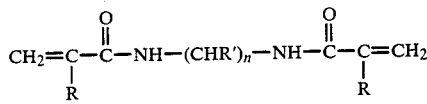   IV wherein R is hydrogen or a $C_1$-$C_3$ alkyl group, R' is hydrogen, a $C_1$-$C_3$ alkyl group or phenyl, n is 1 to 6 when R' is hydrogen and 1 when R' is a $C_1$-$C_3$ alkyl or phenyl group.

Representative of compounds of formula IV above are N,N'-methylene-bis(acrylamide), N,N'-methylene-bis(methacrylamide), N,N'-methylene-bis(α-ethylacrylamide), N,N'-methylene-bis(α-propylacrylamide), N,N'-ethylene-bis(acrylamide), N,N'-ethylene-bis(methacrylamide), N,N'-(1,6-hexamethylene)-bis(acrylamide), N,N'-(1,6-hexamethylene)-bis(methacrylamide), N,N'-ethylidene-bis(acrylamide), N,N'-ethylidene-bis(methacrylamide), N,N'-methylene-bis(N-methyl acrylamide), N,N'-butylidene-bis(methacrylamide) and N,N'-propylidene-bis(acrylamide). These compounds may be prepared by conventional reactions well known in the art, for example, in U.S. Pat. No. 2,475,846 (to American Cyanamid), 1949.

Also useful monomers are those wherein X in formula II above is —O—. When A is alkylene or substituted alkylene, the compounds are polyacrylates of certain polyhydric alcohols. These acrylates may be illustrated by the following formulas.

When A is alkylene, this is descriptive of compounds having the formulas

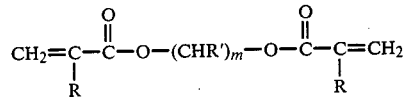   V wherein R is hydrogen or a $C_1$-$C_3$ alkyl group, R' is hydrogen, a $C_1$-$C_3$ alkyl group or phenyl, m is 1 to 8 when R' is hydrogen and 1 when R' is $C_1$-$C_3$ alkyl or phenyl, and

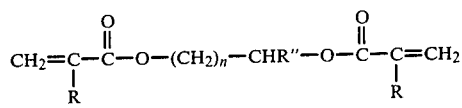   VI wherein R is hydrogen or a $C_1$-$C_3$ alkyl group and R'' is a $C_1$-$C_4$ alkyl group, and n is 1 to 4.

Representative of compounds of formula V are ethylene glycol diacrylate, ethylene glycol dimethacrylate, ethylene glycol di(α-ethylacrylate), ethylene glycol di(α-propylacrylate), 1,3-propylene glycol diacrylate, 1,4-butylene glycol diacrylate, 1,8-octanediol dimethacrylate, and ethylidene-bis(acrylate).

Representative of compounds of formula VI are 1,2-propylene glycol diacrylate, 1,3-butanediol dimethacrylate, and 1,2-butanediol diacrylate.

When X in formula II is —O— and A is substituted alkylene, this is descriptive of compounds having the formulas

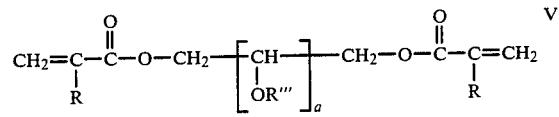   VII wherein R is hydrogen or a $C_1$-$C_3$ alkyl group, R''' is hydrogen or a

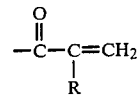

group and a is 1 to 4,

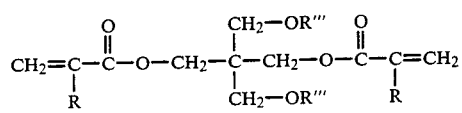   VIII where R is hydrogen or a $C_1$-$C_3$ alkyl group and R''' is hydrogen or a

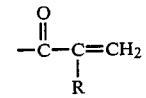

group, and

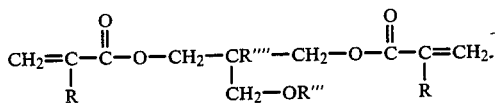   IX wherein R is hydrogen or a $C_1$-$C_3$ alkyl group, R''' is hydrogen or a

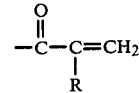

group and R'''' is a methyl or ethyl group.

Representative of compounds of formula VII are glycerol triacrylate, 1,3-glycerol dimethacrylate, erythritol diacrylate, mannitol diacrylate and mannitol trimethacrylate.

Representative of compounds of formula VIII are pentaerythritol diacrylate, pentaerythritol triacrylate, pentaerythritol tetraacrylate and pentaerythritol tetramethacrylate.

Representative of compounds of formula IX are trimethylolethane diacrylate, trimethylolpropane triacrylate and trimethylolpropane dimethacrylate.

Closely related to the preceding acrylates are those which are derived from di-, tri- and tetraethylene glycol and di-, tri- and tetrapropylene glycol. These compounds are those of formula II wherein X is —O— and A is alkylene oxyalkylene, and they may be more specifically illustrated by the formula

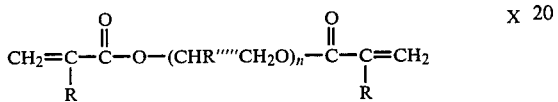

wherein R is hydrogen or a $C_1$–$C_3$ alkyl group, R''''' is hydrogen or methyl and n is 2 to 4. Representative of these compounds are diethylene glycol diacrylate, diethylene glycol dimethacrylate, triethylene glycol diacrylate, triethylene glycol dimethacrylate, tetraethylene glycol diacrylate, tetraethylene glycol dimethacrylate, dipropylene glycol diacrylate, dipropylene glycol dimethacrylate, tripropylene glycol diacrylate, tripropylene glycol dimethacrylate and tetrapropylene glycol diacrylate.

Representative of those monomers which are allyl esters are triallyl cyanurate, diallyl phthalate, diallyl maleate, diallyl fumarate, triallyl trimesate, diallyl adipate and diallyl succinate. Most of these monomers are characterized by the structural formula

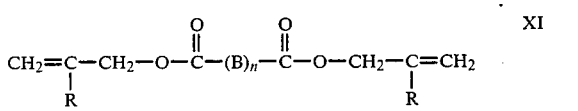

wherein R is hydrogen or a $C_1$–$C_3$ alkyl group, B is vinylene or an arylene, alkylene or substituted alkylene goup, and n is zero or 1. Representative arylene groups are phenylene and naphthylene. Exemplary alkylene groups are methylene and ethylene, and the total number of carbon atoms in the alkylene or substituted alkylene groups is no more than 8. Other useful crosslinking monomers include divinylbenzene, divinylacetylene, diisopropenylbiphenyl and crotyl methacrylate.

The amount of crosslinking monomer may be widely varied. As already mentioned, the crosslinking monomer can constitute all of the ethylenically unsaturated component capable of forming a crosslinked polymer, and preferably will amount to at least about five percent by weight of said ethylenically unsaturated component.

Also useful as crosslinking agents are polymers containing a plurality of addition polymerizable unsaturated linkages. Representative of such polymers are the ethylenically unsaturated addition polymerizable polyesters derived from unsaturated diols or unsaturated dibasic carboxylic acids. Typical polyesters are those derived from maleic or fumaric acid and a phenoxy resin or diols such as ethylene glycol, propylene glycol, trimethylene glycol and diethylene glycol. These unsaturated polymers may be used alone or in combination with a crosslinking monomer.

The photosensitive compositions also may contain a saturated polymer component as a viscosity regulating agent. Exemplary of such polymers are cellulose esters such as cellulose acetate, cellulose acetate succinate and cellulose acetate butyrate; cellulose ethers such as methyl cellulose, ethyl cellulose, benzyl cellulose, hydroxyethyl cellulose and hydroxypropyl cellulose; poly(vinyl alcohol); poly(vinyl alcohol) esters such as poly(vinyl acetate) and copolymers of vinyl acetate with other vinyl monomers such as vinyl chloride, methyl acrylate and methyl methacrylate; poly(vinyl chloride); vinylidene chloride copolymers such as poly(vinylidene chloride-acrylonitrile), poly(vinylidene chloride-methyl acrylate) and poly(vinylidene chloride-vinyl acetate); polyacrylates and polyacrylate esters such as poly(methyl methacrylate) and poly(ethyl methacrylate); poly(ethylene oxide); poly(vinyl acetals) such as poly(vinyl butyral) and poly(vinyl formal) and polystyrene. The saturated polymer component may constitute from about five to about 90% by weight of the photosensitive composition.

The sensitizers used in the process of this invention are generally well known and are characterized as being useful in converting triplet oxygen to singlet oxygen. Among the best sensitizers are fluorescein derivatives, xanthene dyes, porphyrins and porphins, polycyclic aromatic hydrocarbons and phthalocyanines. The preferred sensitizers are methylene blue and zinc tetraphenylporphyrin. Additional useful sensitizers are: erythrosin B; rose bengal; eosin Y; crystal violet; methylene green; safrin bluish; 1,1-diethyl-2,2'-cyanine iodide; 1-ethyl-2[3-(1-ethylnaphtho-[1,2d]thiazolin-2-ylidene-2-methylpropenyl]-naphthol-[1,2a]thiazolium bromide; pinacyanol chloride; ethyl red; 1,1'-diethyl-2,2'-dicarbocyanine iodide; 3,3'-diethyloxycarbocyanine iodide; 3,3'-diethylthiazolino carbocyanine iodide; fluorescein; methylene violet; methylene blue oleate; methylene blue dodecylbenzene sulfonate; copper phthalocyanine; pentacene; naphthacene; copper tetraphenylporphin; tin tetraphenylporphin; acridine orange; methylene violet; Bernthsen; hemin; chlorophyll; porphyrazines; octaphenylporphins; benzoporphins; hypericin; 3,4-benzpyrene; acridine; rubrene; 4,4'-bis(dimethylamino)benzophenone; fluorenone; anthraquinone; phenanthrenequinone; fluorene; triphenylene, phenanthrene; naphthalene; azulene; anthracene; tetracene; carbazole; benzil; benzilic acid; xanthone; anthrone; benzanthrone; coronene; di-α-naphthyl ketone; benzylacetophenone; chrysene; pyrene; 1,2-benzanthracene; acenaphthylene; α-indanone; 1,4-naphthaquinone; phenyl-1-naphthyl ketone; 1-acetonaphthone; 2-acetonaphthone; 1-naphthaldehyde; 1,2,5,6-dibenzanthracene; thioxanthone; 9,10-dichloroanthracene; and benzalacetophenone.

The amount of sensitizer is not critical, but the best results are obtained when the concentration is adjusted so that 50 to 90% or more of the incident light is absorbed at the wavelength corresponding to the absorption maximum of the particular sensitizer employed. The sensitizer may be incorporated into the photosensitive composition when the composition is being formed or it may be diffused into the film of the composition with a suitable solvent. The oxygen required for the reaction normally is obtained from the air present.

However, an atmosphere of pure oxygen may be provided, if desired.

After the endoperoxides have been formed in the exposed areas of the film, they are decomposed to provide the free radicals needed for the polymerization and/or crosslinking reaction. The decomposition reaction is preferably carried out catalytically using, for example, a metal redox catalyst. The catalyst may be added to the photosensitive composition prior to film preparation. The catalyst also may be added subsequent to film exposure. This may be accomplished by any of several means, for example, by spraying, brush coating or contacting the film with a solution of the catalyst in a solvent which is capable of swelling the film.

The preferred catalysts are salts or complexes of metals, preferably transition metals, capable of existing in more than one valence state. Vanadium oxyacetylacetonate, vanadium oxysulfate, vanadium oxy-1,1,1-trifluoroacetylacetonate, vanadium oxy-1-phenylacetylacetonate, ferric acetylacetonate-benzoin, manganese octoate, lead naphthenate and cobaltic acetylacetonate are among the preferred catalysts. Other effective catalysts include titanyl acetylacetonate, cobaltous naphthenate, cobaltous 2-ethylhexanoate, cobaltous stearate, cobaltic stearate, cobaltous acetylacetonate, manganous stearate, manganic stearate, manganous acetylacetonate, magnanic acetylacetonate, manganese naphthenate, zirconium acetylacetonate, vanadyl naphthenate, ferrous sulfate, ferrous pyrophosphate, ferrous sulfide, the ferrous complex of ethylenedinitrilotetraacetic acid, ferrous o-phenanthroline, ferrous ferrocyanide, ferrous acetylacetonate and the corresponding nickel, copper, mercury and chromium compounds. Nonmetallic reducing agents which can be used to carry out decomposition of the hydroperoxides include polyamines such as diethylenetriamine, triethylenetetraamine, tetraethylenepentamine, monoamines, sodium hyposulfite and sulfur dioxide. The decomposition reaction can also be initiated thermally.

The photosensitive compositions also may contain up to about 50% by weight of an inert particulate filler which is essentially transparent to the radiation used. Representative of such fillers are the organophilic silicas, the bentonites, silica and powdered glass, all having a particle size less than 0.4 mil in their maximum dimension. Particles of 0.1 micron or less in size are preferred. Such fillers can impart desirable properties to the photosensitive compositions. For example, use of submicron silica affords a printing plate with a harder and more durable image.

In the preparation of some of the photosensitive compositions used in the process of this invention, it may be desirable to have present a small amount of a phenolic antioxidant to act as an inhibitor for premature thermal polymerization during processing or storage of the compositions. Such antioxidants are well known in the art and they are exemplified by hydroquinone, di-t-butyl-p-cresol, hydroquinone monomethyl ether, pyrogallol, quinone, t-butylcatechol, hydroquinone monobenzyl ether, methylhydroquinone, amylquinone, amyloxyhydroquinone, n-butylphenol, phenol and hydroquinone monopropyl ether. The phenolic antioxidant may be used in an amount within the range of from about 0.001 to about 2% by weight, preferably about 1% by weight, based on the ethylenically unsaturated component of the photosensitive composition.

The photosensitive compositions of the process of this invention are deposited as a film on a support, selectively exposed to light and polymerized and/or crosslinked in the exposed areas. The unexposed areas of the film then are removed by use of a suitable solvent for the photosensitive composition or by other means such as use of an air knife exposing the substrate. The photosensitive compositions of the process of this invention may be used to prepare negative or positive working lithographic plates. In preparing a negative working plate, the photosensitive compositions are deposited as a film on a metal backing support, are selectively exposed to light and polymerized and/or crosslinked in the exposed areas. The unexposed areas of the film are removed, exposing a hydrophilic metal substrate. If the high polymer formed in the exposed areas of the film is oleophilic, it accepts greasy ink, whereas the metal surface corresponding to the unexposed areas of the film, being hydrophilic, accepts water and rejects the greasy ink. In preparing a positive working plate, the photosensitive compositions are hydrophilic and are deposited as a film on an oleophilic backing sheet. Selective exposure to light polymerizes and/or crosslinks the exposed areas and the unexposed areas are then removed. Since the crosslinked polymer found in the exposed areas of the film is hydrophilic, it accepts water and rejects greasy ink, whereas the oleophilic backing corresponding to the unexposed area of the film accepts the greasy ink.

Ordinarily, the support member of a lithographic plate is metal-surfaced or composed of entire sheets of metal. Metals such as aluminum, zinc, chromium, tin, magnesium and steel may be used. Aluminum and zinc are preferred. In the case of metallic surfaces, oxides may be present, either through exposure to air or through special treatment. For example, in the case of aluminum, the surface may, if desired, be chemically or electrolytically anodized. In the case of a positive working lithographic plate it may be desirable to coat the metal support with a durable, oleophilic polymer coating before applying the photosensitive composition. In casting the photosensitive composition onto the support, a solution of the components in a suitable solvent may be used, and conventional coating techniques may be employed. Alternatively, those photosensitive compositions of the process of this invention which are thermoplastic may be thermoformed in plastic fabrication equipment onto a metal substrate.

When the photosensitive elements prepared as described above are subjected to the process of this invention, the photosensitive composition becomes crosslinked in the exposed areas, whereas the composition in the unexposed areas remains soluble. Subsequent removal of the soluble material, as by washing of the plate, leaves an image of the negative or positive used in the process. The solvent used in washing the plate will vary according to the solubility of the photosensitive composition. Removal of the soluble material from the unexposed areas may frequently be accelerated by brushing or scrubbing. In large scale work, application of the solvent will advantageously be carried out by means of jets or sprays.

The printing surfaces made in accordance with this invention are particularly applicable in lithography. However, they also are useful in classes of printing wherein the ink is carried by the raised portion of the relief, such as in dry offset printing and ordinary letterpress printing. Furthermore, the photosensitive compositions of this invention may be used as photoresists over an etchable metal. In this instance, a thin layer of the composition will become insolubilized in irradiated areas and protect the metal beneath from etching, as in a photoengraving process.

In the following examples, the sensitizer is shaken with the solvent in the dark for approximately 2½ hours. This solution is then added to the other components of the photosensitive composition and shaken an additional hour.

The solution is used to coat a 10×16×0.012-inch grained aluminum plate (Lith-Kem-Ko) on a Model 2024 Tasopa Face Up Whirler set at 6 with a 3-minute spinning period. The plate is then dried by two passes through an infrared drying line at 210° C. at 16 inches/minute or by storage in light-tight boxes. Plates are stored in light-tight boxes with their surfaces uncovered until used.

The plates are exposed with an Opti-Copy projection unit at a 2:1 magnification. A 6-second exposure corresponding to approximately 400 foot-candle seconds is employed. The projection target consists of bars of Wratten filters combined with an optical density 1.0 Wratten filter overlay over a portion of the bars to give blocks with optical densities of: 0.0, 0.3, 0.6, 0.9, 1.0, 2.0, 0.0, 1.3, 1.6, 1.9, 2.0, 3.0. A 3×5 inch portion of the plate is cut for exposure with this target while held on a vacuum frame.

After exposure, the plate is evacuated with a vacuum pump for 2 or 3 minutes with its surface uncovered and then heated for 5 minutes with continuing vacuum. When an infrared processing unit is used for heating, a series of infrared tubes heats the plate from above by radiant heat. A thermocouple on a small test plate controls the heat cycling to give the desired temperature. When a resistance element heating unit is used, a resistance heating element under the plate is heated to the desired temperature and then cycled on and off while controlled by a thermocouple. At the end of the heating cycle the vacuum is automatically released. The plate is removed from the processor and allowed to cool before etching.

A rotary drum etcher is used with an etchant comprising 2% sodium bicarbonate, 1% Renex 30 polyoxyethylene tridecyl ether (ICI Americas, Inc.), and 5% butyl Cellosolve etchant which may contain a defoamer if needed. The etching solution is warmed to ~30° C. before use.

EXAMPLE 1

A solution containing 10.5 parts by weight maleated phenoxy resin (45.2% of —OH groups esterified), 4.2 parts pentaerythritol triacrylate, 1.0 part 2,5-diphenyloxazole, 0.6 parts zinc tetraphenylporphyrin, and 0.018 parts vanadyl acetylacetonate in 65 parts of Cellosolve acetate is coated on a grained aluminum plate. The maleated phenoxy resin is obtained by reacting the polymer prepared from Bisphenol A and epichlorohydrin with maleic anhydride to esterify about 50% of the alcohol groups. After air-drying in the dark, a portion of the plate is exposed for 6 seconds and processed to 80° C. in a resistance element heating unit. After etching for 2½ minutes, an image is obtained with insolubilization visible through step 3.

TABLE 1

| Step No. | O.D. |
| --- | --- |
| 1 | 0.0 |
| 2 | 0.3 |
| 3 | 0.6 |

TABLE 1-continued

| Step No. | O.D. |
| --- | --- |
| 4 | 0.9 |

EXAMPLES 2-5

Solutions are prepared as in Example 1 using a maleated phenoxy resin with 52.1% of the —OH groups esterified, and the amounts of 2,5-diphenyloxazole shown in Table 2. After coating, the plates are dried in an infrared drying line before storage in the dark. Portions of the plates are exposed, processed, and etched as in Example 1 to give images with the last good step corresponding to the original optical densities (O.D.) shown in Table 2.

TABLE 2

| Example | Diphenyloxazole (parts by weight) | O.D. |
| --- | --- | --- |
| 2 | 1.0 | 0.3 |
| 3 | 2.0 | 0.6 |
| 4 | 0.5 | 0.3 (fair) |
| 5 | 0.1 | 0.0 (trace) |

EXAMPLES 6-12

Solutions and plates are prepared as in Example 1 using a maleated phenoxy resin with 52.1%, 45.2%, or 43.5% of the —OH groups esterified, and the metal catalyst shown in Table 3. Portions of the plates are exposed, processed, and etched as in Example 1 to give images with the last good step corresponding to the original optical densities shown in Table 3.

TABLE 3

| Example | Catalyst (parts by weight) | O.D. |
| --- | --- | --- |
| 6 | 0.018 Vanadyl acetylacetonate | 0.6 |
| 7 | 0.018 Ferrous acetylacetonate | 0.6 |
| 8 | None | 0.3 (weak) |
| 9 | 0.024 Ferric acetylacetonate | 0.0 (faint) |
| 10 | 0.017 Cobaltous acetylacetonate | 0.0 |
| 11 | 0.024 Cobaltic acetylacetonate | 0.3 |
| 12 | 0.054 Nuodex 8% Copper* | 0.3 |

*Contains 80% copper naphthenate (equivalent to 8.0% copper as metal) and 20% petroleum distillate.

EXAMPLE 13

A solution and plate are prepared as in Example 1 using a maleated phenoxy resin with 56.2% of the —OH groups esterified, and drying in an infrared drying line. Portions of the plates are exposed, processed with infrared heating, and etched as before to give images with the last good step corresponding to the original optical densities shown in Table 4.

TABLE 4

| Temperature (°C.) | O.D. |
| --- | --- |
| 40° | — |
| 50° | 0.0 |
| 65° | 0.3 |
| 78° | 0.3 |
| 88° | 1.0 |
| 98° | 1.0 (peeling) |
| 110° | Peeled |

EXAMPLE 14

A solution and plate are prepared as in Example 13 replacing the diphenyloxazole with 1.2 parts 2-(α-naphthyl)-5-phenyloxazole. A portion of the plate is exposed, processed to 80° C., and etched as in Example 1 to give an image with the last good step corresponding to an original optical density of 0.9.

EXAMPLES 15–16

Solutions and plates are prepared as in Example 13 replacing the diphenyloxazole with 1.0 part 2,5-diphenylfuran and using a maleated phenoxy resin with 45.2% of the —OH groups esterified. For Example 16, the vanadyl acetylacetonate is replaced with 0.018 part ferrous acetylacetonate. Portions of the plate are exposed, processed to 120° C., and etched as in Example 1 to give images with a good step of 0.6 and a weak step of 0.3 respectively.

EXAMPLE 17

A solution and plate are prepared as in Example 13 replacing the diphenyloxazole with 0.8 part 9-methylanthracene, replacing the vanadyl acetylacetonate with 0.017 part cobaltous acetylacetonate and using a maleated phenoxy resin with 46.8% of the —OH groups esterified. A portion of the plate is exposed, processed to 140° C., and etched as in Example 1 to give an image with a faint step corresponding to an original optical density of 0.3.

EXAMPLE 18

A solution and plate are prepared as in Example 13 replacing the diphenyloxazole with 0.5 part 1,3-diphenylisobenzofuran and using a maleated phenoxy resin with 45.2% of the —OH groups esterified. A portion of the plate is exposed, processed to 80° C., and etched as in Example 1 to give an image with a faint step corresponding to an original optical density of 0.0, i.e. an image is produced without any reduction of light intensity by the filters.

EXAMPLE 19

A solution and plate are prepared as in Example 13 replacing the diphenyloxazole with 0.8 part tetraphenylcyclopentadienone and using a maleated phenoxy resin with 52.1% of the —OH groups esterified. Before exposure, the plate is heated in air at 80°C. for 5 minutes. Then a portion of the plate is exposed, processed to 120° C., and etched as in Example 1 to give an image with a weak step corresponding to an original optical density of 0.0. If the pre-exposure heating is omitted, etching of the final plate is very slow and an image is not obtained.

What I claim and desire to protect by Letters Patent is:

1. In a process for producing a photographic image which comprises (A) exposing selected areas of a photosensitive composition in film form to light having a wavelength of from about 2,000 to about 12,000 Angstroms in the presence of oxygen to form oxidation products in said areas, said photosensitive composition comprising a mixture of (1) a photooxygenation sensitizer, (2) a polymerizable ethylenically unsaturated component selected from the group consisting of ethylenically unsaturated monomers, ethylenically unsaturated polymers and mixtures thereof, capable of forming a high molecular weight polymer by addition polymerization or crosslinking, and (3) a photooxidizable component, (B) decomposing said oxidation products in the absence of oxygen to form free radicals which effect insolubilization of the composition in the exposed areas of the film, and (C) developing the images by washing away the uncrosslinked composition, the improvement wherein the photooxidizable component comprises a cyclic, cisoid conjugated diene capable of 1,4-addition with singlet oxygen to form an endoperoxide.

2. The process of claim 1 wherein component (2) is an ethylenically unsaturated monomer.

3. The process of claim 1 wherein component (2) is an ethylenically unsaturated polymer.

4. The process of claim 1 wherein component (2) is a mixture of an ethylenically unsaturated monomer and an ethylenically unsaturated polymer.

5. The process of claim 1 wherein component (3) is a compound having the formula

where X is —O—,

or part of an anthracene ring system and a, b, c and d are —N= or an unsubstituted or aryl-substituted C atom which may be part of a carbocyclic ring system.

6. The process of claim 5 wherein component (3) is 2,5-diphenyloxazole.

7. The process of claim 1 wherein the photosensitive composition also contains a saturated polymer.

8. The process of claim 1 wherein the light has a wavelength of from about 3,900 to about 7,700 Angstroms.

9. The process of claim 1 wherein the endoperoxides are decomposed by the action of heat.

10. The process of claim 1 wherein the endoperoxides are decomposed by the action of a reducing agent.

11. The process of claim 10 wherein the reducing agent is present in the composition initially.

12. The process of claim 10 wherein the reducing agent is added subsequent to exposure.

13. The process of claim 1 wherein the endoperoxides are decomposed by the action of a metal catalyst.

14. The procss of claim 13 wherein the metal catalyst is a transition metal catalyst.

15. In a process for producing a photographic image which comprises (A) exposing selected areas of a photosensitive composition in film form to light having a wavelength of from about 2,000 to about 12,000 Angstroms in the presence of oxygen to form oxidation products in said areas, said photosensitive composition comprising a mixture of (1) a photooxygenation sensitizer, (2) a polymerizable ethylenically unsaturated component selected from the group consisting of ethylenically unsaturated monomers, ethylenically unsaturated polymers and mixtures thereof, capable of forming a high molecular weight polymer by addition polymerization or crosslinking, and (3) a photooxidizable component, (B) decomposing said oxidation products by the action of an agent selected from the group consisting of transition metal catalysts and reducing agents to form free radicals which effect insolubilization of the composition in the exposed areas of the film, and (C) developing the images by washing away the uncrosslinked composition, the improvement wherein the photooxidizable component comprises a cyclic cisoid conjugated diene capable of 1,4-addition with singlet oxygen to form an endoperoxide.

16. In a photopolymer element prepared according to the process which comprises (A) depositing as a film on a support a photosensitive composition comprising as essential components (1) a photooxygenation sensitizer, (2) a polymerizable ethylenically unsaturated component selected from the group consisting of ethylenically unsaturated monomers, ethylenically unsaturated polymers and mixtures thereof, capable of forming a high molecular weight polymer by addition polymerization or crosslinking, and (3) a photooxidizable component, (B) exposing selected areas of the film of photosensitive composition to light having a wavelength of from about 2,000 to about 12,000 Angstroms in the presence of oxygen to form oxidation products in said exposed areas, (C) decomposing said oxidation products in the absence of oxygen to form free radicals which effect insolubilization of the composition in the exposed areas of the film and (D) developing an image by washing away the uncrosslinked composition, the improvement wherein the photooxidizable component comprises a cyclic cisoid conjugated diene capable of 1,4-addition with singlet oxygen to form an endoperoxide.

17. The photopolymer element of claim 16 wherein the element is a lithographic plate.

18. The photopolymer element of claim 16 wherein the element is a relief printing plate.

19. The photopolymer element of claim 16 wherein the element is a photoresist.

* * * * *

UNITED STATES PATENT AND TRADEMARK OFFICE
CERTIFICATE OF CORRECTION

PATENT NO. : 4,666,824
DATED : May 19, 1987
INVENTOR(S) : Wayne R. Messer

It is certified that error appears in the above-identified patent and that said Letters Patent are hereby corrected as shown below:

Column 3, Line 8 " $1.0 \times 10^{312}$ "

should read -- $1.0 \times 10^{-2}$ --

Signed and Sealed this

Third Day of November, 1987

Attest:

DONALD J. QUIGG

*Attesting Officer*     *Commissioner of Patents and Trademarks*